United States Patent [19]

Herzer et al.

[11] 4,060,392
[45] Nov. 29, 1977

[54] DEVICE FOR THE SUPPORT OF A CRYSTALLINE ROD

[75] Inventors: Heinz Herzer; Helmut Zauhar, both of Burghausen, Germany

[73] Assignee: Wacker-Chemitronic Gesellshaft fur Elektronik Grundstoffe mbH, Burghausen, Germany

[21] Appl. No.: 687,711

[22] Filed: May 19, 1976

[30] Foreign Application Priority Data

July 1, 1975 Germany ............................ 2529366

[51] Int. Cl.² ............................................ B01J 17/10
[52] U.S. Cl. ............................. 23/273 SP; 156/620; 248/309 R; 248/358 R; 269/237; 269/321 T
[58] Field of Search ........... 23/273 SP, 273 Z, 273 R; 156/620, 617 SP, 617 R, 600; 248/309 R, 94, 311.1, 313, 314, 358 R; 269/237, 321 T; 13/13 ZM

[56] References Cited

U.S. PATENT DOCUMENTS

| | | | |
|---|---|---|---|
| 3,191,924 | 6/1965 | Haus | 23/273 Z |
| 3,211,881 | 10/1965 | Jablonski et al. | 23/273 Z |
| 3,901,499 | 8/1975 | Sporrer | 23/273 SP X |
| 3,923,468 | 12/1975 | Keller | 23/273 SP X |

Primary Examiner—Norman Yudkoff
Assistant Examiner—Barry I. Hollander
Attorney, Agent, or Firm—Allison C. Collard

[57] ABSTRACT

Device for supporting a crystalline rod during crucible-free zone melting which comprises a zone-drawing apparatus, a rotating shaft in said apparatus, means for fastening the shaft in the apparatus, a screw bolt mounted for rotation with the shaft, the top end of the screw bolt having a bore for receiving a seed crystal, two or more swivel arms mounted adjacent to the bore and capable of being opened and closed, a ring coaxially surrounding the bolt and means for vertically moving the ring.

5 Claims, 1 Drawing Figure

U.S. Patent  Nov. 29, 1977  4,060,392
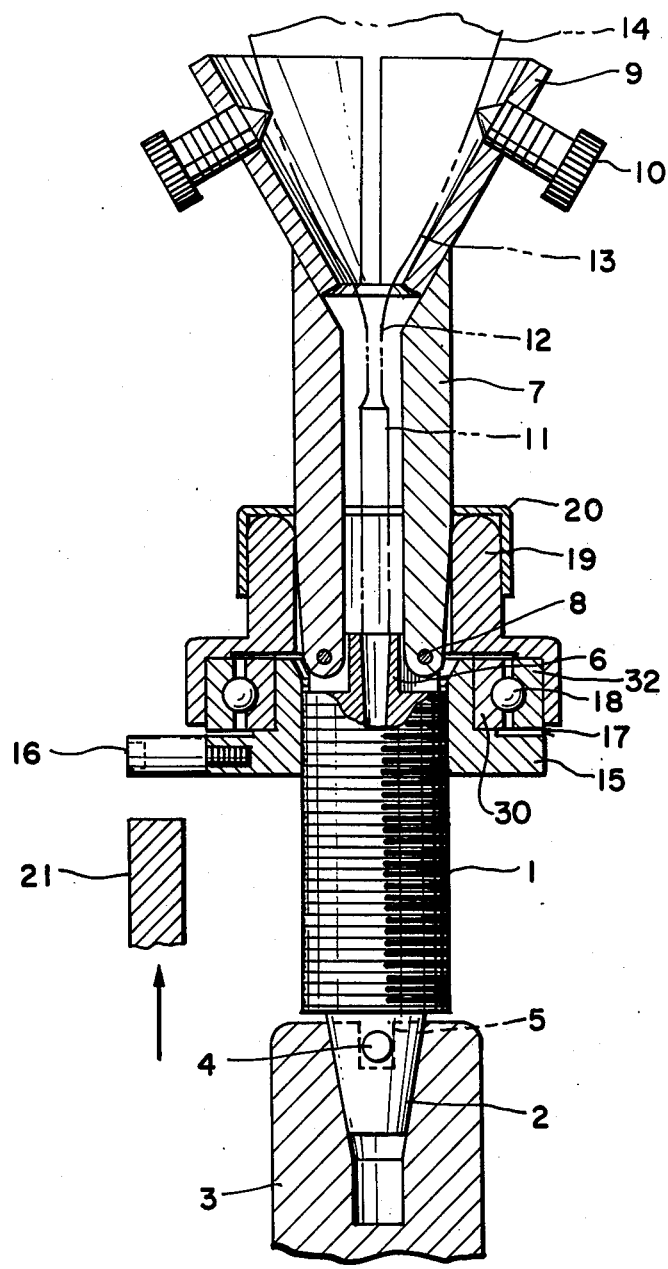

DEVICE FOR THE SUPPORT OF A CRYSTALLINE ROD

This invention relates to a device for supporting a crystalline rod, particularly a rod consisting of semiconductive material, during a crucibe free zone melting process.

In the known process of crucible free zone melting, polycrystalline semiconductive material is converted into monocrystalline material by means of seed crystals. In that process, the rod is melted down starting at the contact point of the seed crystal with the rod with a suitable heating device, for instance, an induction coil, and the melting zone is drawn over the entire length of the rod by a relative movement of the rod shaped body with respect to the heating device, the melting zone taking up any impurities present.

When the semiconductive material is processed to structural elements, faults in the crystal structure, especially displacements, prove to be very disadvantageous, since they decrease the useful life of the minority carriers.

A method which is extensively used for drawing displacement free semiconductors, consists of restricting the cross-section of the rod in the immediate vicinity of the melting point with the seed crystal, before the last passage of the melting zone through the semiconductor rod. By this constriction between seed crystal and semiconductor rod, the spreading of displacements from the seed crystal to the semiconductor rod can be avoided. It is, however, a diadvantage of this method that the constriction sets narrow limits to the length and weight of the semiconductor rod placed upon the seed crystal. When a rod of considerable length or high weight is caused to oscillate due to external occurrences, there are the possibilities of the liquid melting zone dripping or the rod breaking at the point of constriction.

From the German Laid Open Paper (Offenlegungsschrift) No. 1,519,901 filed 9/23/66 and laid open on 12/12/70 is is known to provide a sheath for the vertical coaxial holder of the end of the rod attached to the seed crystal, the sheath being axially movable with respect to the holder and having at its edge facing the semiconductor rod, at least three supports placed at equal angles with respect to each other. The rigidly attached supports hold the rod in its conically shaped transition piece, but since as a rule the latter does not grow with absolute uniformity, a uniform pressure application is not guaranteed.

It is the object of the present invention to provide a device affording a more effective mechanical support of the growing monocrystalline rod portion. Other objects and advantages of the invention will become apparent from the following detailed description and the accompanying drawing.

In accordance with the invention a device is provided for supporting a crystalline rod, especially a semiconductor rod, during crucible-free zone melting, which comprises a zone drawing apparatus having a lower rotating shaft with a screw bolt mounted thereon; the upper end of the bolt has a bored opening for receiving the seed crystal and mounted at this end are two or more swivel arms capable of being moved to open and closed positions; also provided is a ring coaxially surrounding the screw bolt and adjustable in vertical direction.

The swivel arms are preferably rounded externally and are attached to the top end of the screw bolt, so that in their closed position they will take up the same area as the cross section of the bolt, in other words, they will not extend beyond its outer coaxial limit. The swivel arms are preferably bucket-shaped at their free ends and have adjusting screws fitted into the bucket, said screws enabling them to effectively support even irregularly growing rods.

The accompanying drawing shows, partly in elevation and partly in section, an examplary embodiment of the device according to the invention.

A metal screw bolt, e.g., a steel bolt designated by 1 is fitted, preferably by means of a conical bottom portion 2, into a rotating shaft 3 of a zone drawing apparatus (not shown). A pin 4 engaging with a notch 5 is provided for securing portion 2 in shaft 3. The top end 6 of screw bolt 1 is so shaped that two swivel arms 7 can be secured thereto by means of pins 8. The swivel arms 7 are externally rounded, conically tapering toward the axis of rotation and take up, when in a closed position, the cross-sectional area of bolt 1. The upper ends of the arms 7 merge into buckets 9, into which adjusting screws 10 are fitted.

An opening is bored into the top of bolt 1 between the arms 7 to receive a seed crystal 11 on which the crystalline rod 14 grows passing the constriction 12 and a conically shaped transition portion 13.

Screwed into bolt 1 is a ring nut 15 which can be arrested by a fastening bolt 16. On the upper surface of nut 15, an annular groove 17 is formed into which a ball bearing assembly 18 is fitted. The ball bearing assembly includes an annular inner race 30, secured on ring nut 15, an annular outer race 32, secured on an annular ring 19, which coaxially surrounds bolt 1 and ball bearings 18 sandwiched and slidably supported between the outer and inner races thereof; ring 19 is protected against dripping liquid rod material, e.g. silicon by a cover 20.

The supporting device operates as follows:

A seed crystal 11 is placed into the bore at the upper end 6 of bolt 1 attached to rotating shaft 3 of the zone melting apparatus. Ring nut 15 is at that time screwed down as far as possible on bolt 1, so that the swivel arms hang/down over ring 19. Then, the drawing process is started and carried on in the known manner, until a silicon rod 14 of a few centimeters in length has grown. At that time, an arm 21 engages with fastening bolt 16 arresting ring nut 15 so that it can no longer rotate with bolt 1, but is screwed upward on the bolt. At the same time, ring 19 is likewise moved upwardly and swings arms 7 upward and thereby causes buckets 9 at the upper ends of arms 7 slowly to move toward the conical transition piece of silicon rod 14 however, it should be appreciated that, due to the ball bearing assembly, annular ring 19 is not rotated as it moves upwardly. Due to the decreasing angle of incidence between swivel arms 7 and ring 19, the movement of arms 7 toward the rod becomes increasingly slower in spite of the constant rpm of shaft 3. A rigid supporting action is accomplished, especially by the conical taper of the bottom ends of arms 7. By appropriate turning of adjustment screws 10 in buckets 9, even irregularly grown rods can be held securely.

The device according to the invention makes it possible to grow monocrystalline rods of great length and large diameters. Rods which are drawn by means of the device according to the invention are distinguished by a high quality of the crystals, since no undefined movements in an asymmetrical temperature field or high frequency field can occur. On the other hand, the use of the device according to the invention is advisable even in a case when the re-solidifying monocrystalline rod portion is supposed to move in defined and stabilized eccentric rotations, such as particularly, rosette movements toward the heating device, in order to obtain an even course of the specific resistance.

While only a single embodiment of the present invention has been shown and described, it will be obvious to those skilled in the art that many changes and modifications may be made thereunto without departing from the spirit and scope of the invention.

What is claimed is:

1. A device for supporting a crystalline rod and a seed crystal during crucible-free zone melting, said device being coupled to the rotatable shaft of a zone-drawing apparatus, comprising:

an externally threaded screw bolt mounted for rotation with the shaft, the top end of the screw bolt having an axially extending bore formed therein for receiving a seed crystal;

at least two vertically pivotable swivel arms, the lower ends of which are pivotably mounted adjacent to the bore and the outer ends of which are movable radially outwardly and inwardly relative to the axis of said bore to define respectively an open and closed position of said arms;

a ring coaxially surrounding the bolt and said inner ends of said arms and in sliding contact with said swivel arms and which is non-rotatably vertically movable so as to effect movement of said swivel arms between said open and closed positions; and means for non-rotatably vertically moving said ring so as to non-rotatably adjust the position of said swivel arms with respect to said bolt during the zone-melting operation.

2. The device according to claim 1, wherein said means for vertically moving said ring includes an annular nut threadably received on said bolt, a ball-bearing assembly having ball bearings received between an inner and outer annular race, the inner race of which is fixably an coaxially mounted on said annular nut and the outer race of which is fixably mounted to said ring so that upon rotational movement of said nut which, causes vertical movement of said ring and, in turn, vertical movement of said swivel arms, no rotational movement is imparted to said ring and swivel arms.

3. The device according to claim 1, wherein the swivel arms are rounded externally and dimensioned so that in closed position they occupy the same area as the cross section of the bolt.

4. The device according to claim 1 wherein the swivel arms are bucket-shaped at their free ends.

5. The device according to claim 4 wherein adjusting screws are provided in said buckets.

* * * * *